(12) United States Patent
Madajczak

(10) Patent No.: US 7,281,083 B2
(45) Date of Patent: Oct. 9, 2007

(54) NETWORK PROCESSOR WITH CONTENT ADDRESSABLE MEMORY (CAM) MASK

(75) Inventor: Tomasz B. Madajczak, Gdańsk (PL)

(73) Assignee: Intel Corporation, Santa Clara, CA (US)

( * ) Notice: Subject to any disclaimer, the term of this patent is extended or adjusted under 35 U.S.C. 154(b) by 391 days.

(21) Appl. No.: 10/882,830

(22) Filed: Jun. 30, 2004

(65) Prior Publication Data

US 2006/0004956 A1   Jan. 5, 2006

(51) Int. Cl.
*G06F 12/00* (2006.01)
(52) U.S. Cl. ...................... 711/108; 711/160
(58) Field of Classification Search ...................... None
See application file for complete search history.

(56) References Cited

U.S. PATENT DOCUMENTS 6,643,737 B1 *  11/2003  Ono ........................... 711/128
6,697,276 B1 *   2/2004  Pereira et al. ................ 365/49
6,831,850 B2 *  12/2004  Pereira et al. ................ 365/49
2005/0038964 A1 *  2/2005  Hooper et al. ............... 711/143

OTHER PUBLICATIONS

Intel Corporation, "Intel® Internet Exchange Architecture Portability Framework," Developer's Manual, Apr. 2006, pp. 1-142.
Intel Corporation, "Intel® IXP2800 Network Processor," Hardware Reference Manual, Jul. 2005, pp. 1-406.

* cited by examiner

*Primary Examiner*—Reginald Bragdon
*Assistant Examiner*—Ngoc Dinh
(74) *Attorney, Agent, or Firm*—Blakely, Sokoloff, Taylor & Zafman LLP

(57) ABSTRACT

According to embodiments of the present invention, a network processor includes a content addressable memory (CAM) unit having CAM arranged in banks and sharable among microengines. In one embodiment, a mask having a value is used to select/enable one group of CAM banks and to deselect/disable another group of CAM banks. A tag may be looked up in the selected/enabled CAM banks based on the mask value. Upon a "miss," the CAM banks provide the least recently used (LRU) entry. A LRU entry reelection tree may reelect the LRU entry from among all the CAM banks.

26 Claims, 9 Drawing Sheets

| ENTRY/TAG (CONTENT ADDRESS) 1002 | LOCK STATUS 1004 | USAGE COUNTER VALUE 1006 | BASE ADDRESS OF SCRATCH MEMORY REGION FOR BANK 1008 | SCRATCH MEMORY WORD LINE SIZE 1010 |
|---|---|---|---|---|

NETWORK PROCESSOR WITH CONTENT ADDRESSABLE MEMORY (CAM) MASK

BACKGROUND

1. Field

Embodiments of the present invention relate to network processors and, in particular, to content addressable memory (CAM) in network processors.

2. Discussion of Related Art

Networks enable computers and other devices to communicate with each other. Devices commonly communicate with each other by passing packets of information among themselves. A packet typically includes a payload and a header. The header can include the address of the destination device and the payload can include the information (data, video, audio, etc.) for the device.

A given packet may "hop" across many different intermediate network devices, such as switches, routers, bridges, etc., before reaching its destination. The intermediate devices often perform a variety of packet processing operations. For example, intermediate devices often perform address lookup and packet classification to determine how to forward the packet further towards its destination or to determine the quality of service to provide to the packet. Conventional methods of determining how to forward a packet tend to be relatively slow, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 10 is a diagram showing a CAM bank according to an embodiment of the present invention.

DETAILED DESCRIPTION OF THE ILLUSTRATED EMBODIMENTS

Figure 1:
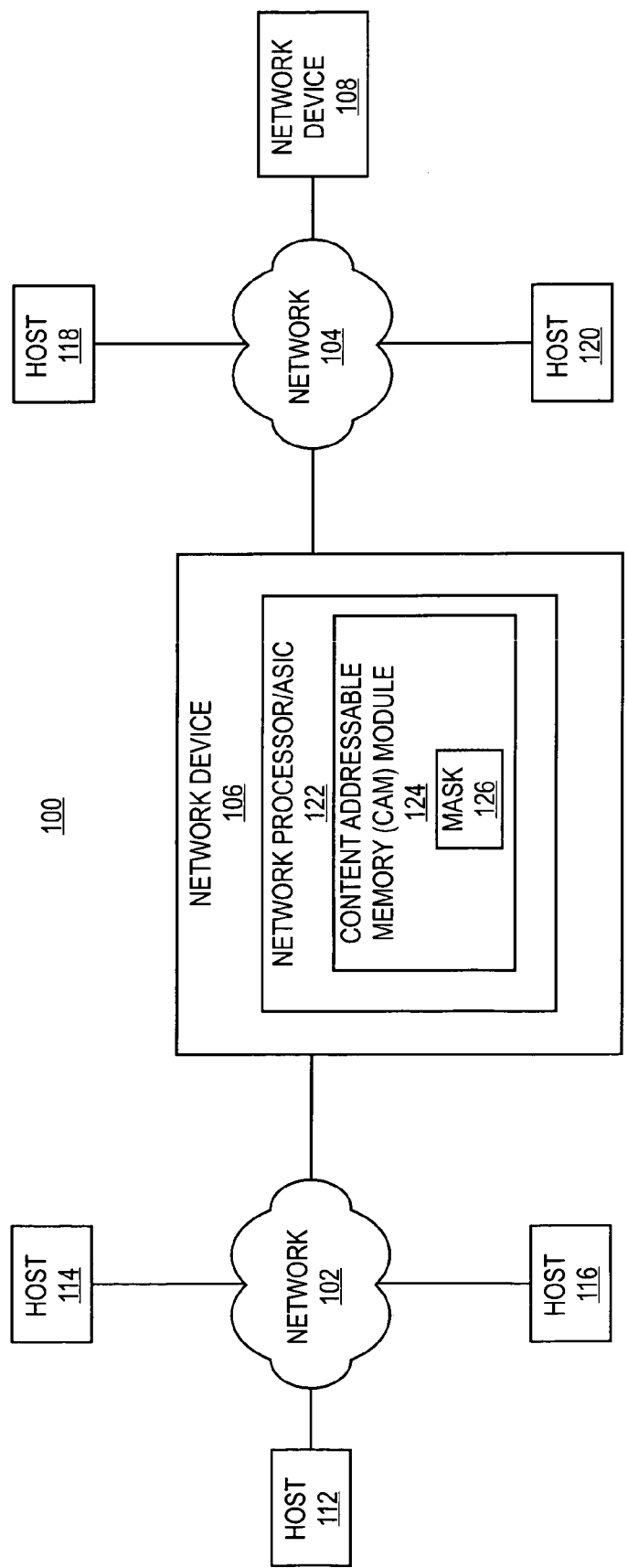
FIG. 1 is a high-level block diagram of an architecture according to an embodiment of the present invention.

FIG. 1 is a high-level block diagram of an architecture 100, for example, an Internet architecture, according to an embodiment of the present invention. The architecture 100 in the illustrated embodiment includes a network 102 coupled to a network 104 via a network device 106. In the illustrated embodiment, the network device 108 is coupled to the network 104. Several hosts 112, 114, 116 are coupled to the network 102, and hosts 118 and 120 are coupled to the network 104. In one embodiment, the example network device 106 includes a network processor 122. In alternative embodiments the device 122 may be an application specific integrated circuit (ASIC).

In one embodiment, the example network processor/ASIC 122 includes a content addressable memory (CAM) module 124. In the illustrated embodiment, the CAM module 124 includes a mask 126.

In embodiments, the architecture 100 may utilize circuit-switching technology, packet-switching technology, and/or a combination of circuit-switching and packet switching technology. One or more of the networks 102 and/or 104 may be a metropolitan area network (MAN) and/ or a local area network (LAN). The network devices 106 and 108 may be switches, routers, bridges, or other suitable network device.

The hosts 112, 114, 116, 118, and can be conventional computers attached to the architecture 100 in an effort to communicate with each other or other computers attached to the architecture 100. Accordingly, the hosts 112, 114, 116, 118, and 120 can be large mainframe computers (e.g., servers), desktop systems, hand-held devices (e.g., a personal digital assistant (PDA)), embedded control systems, and/or the like.

In embodiments in which the device 122 includes a network processor, the network processor 122 may be an Intel® Internet exchange network Processor (IXP), which has one or more microengine clusters (shown below in FIG. 8). In embodiments in which the device 122 includes the ASIC, the ASIC 122 may be a custom integrated circuit designed to implement embodiments of the present invention.

Figure 2:
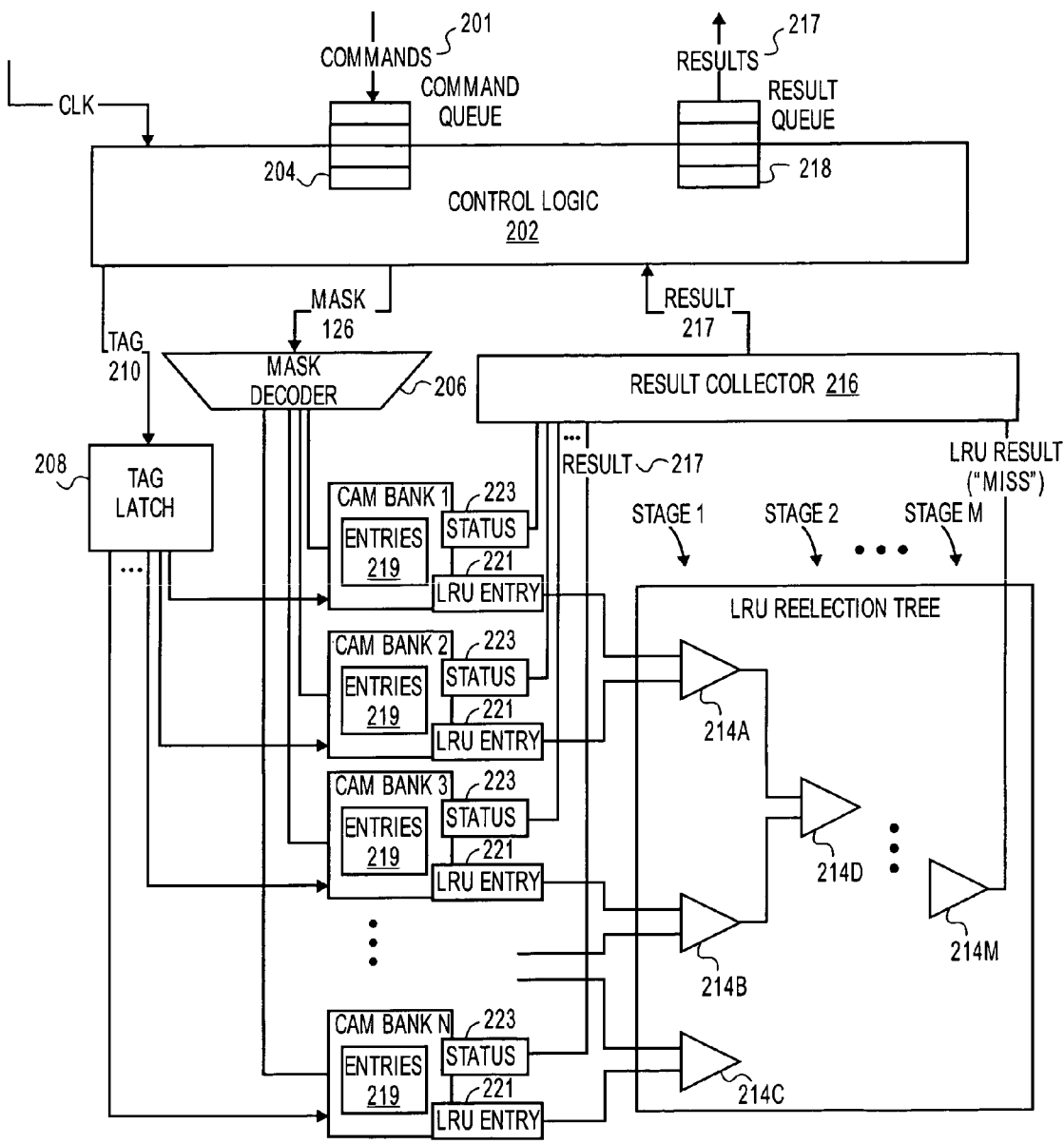
FIG. 2 is a schematic diagram of a content addressable memory (CAM) unit according to an embodiment of the present invention.

FIG. 2 is a schematic diagram of the CAM module 124 according to an embodiment of the present invention. In the illustrated embodiment, the CAM module 124 includes control logic 202, which includes a command queue 204 coupled to receive commands 201. In the illustrated embodiment, the CAM module 124 includes a mask decoder 206 and a tag latch 208 coupled to the control logic 202. A tag 210 (which also may be called a "content address") is coupled from the control logic 202 to the tag latch 208. In the illustrated embodiment, the mask decoder 206 and tag latch 208 are coupled to several CAM banks (CAM bank 1, CAM bank 2, CAM bank 3, through CAM bank N). In the illustrated embodiment, the CAM banks are coupled to a least recently used (LRU) reelection tree 212 and to a result collector 216. In the illustrated embodiment, the LRU tree 212 includes several comparators 214 coupled in stages. In one embodiment, the LRU entry reelection tree 212 may include $\log_2 N$ stages, where N is the number of CAM banks in the CAM unit 124 being utilized. In one embodiment, the result collector 216 may be coupled to deliver one or more results 217 to a result queue 218 in the control logic 202.

In the illustrated embodiment, the CAM banks (CAM bank 1, CAM bank 2, CAM bank 3, through CAM bank N) include entries 219, a least recently used (LRU) entry 221, and a status register 223. The entries 219 may store values to be looked up. In embodiments of the present invention, a microengine in the network processor 122 (shown and described below with reference to FIG. 8) may issue a command 201 to look up a value in at least one entry 219 in at least one CAM bank.

For purposes of illustration, suppose that a microengine in the network processor 122 issues a command 201 to lookup the tag 210 in CAM bank 2 and CAM bank 3 and not in the other CAM banks. In embodiments of the invention, there may be two results 217 of the lookup. A "miss" result 217 indicates that the lookup value was not found in an entry 219 in the designated CAM banks. A "hit" result 217 indicates that the lookup value was found in an entry 219 in a designated CAM bank. The lookup result 217 ("hit" or "miss") may include the status ("hit" or "miss") stored in the status register 223 and may be indicated by the value in a destination register bit, which a branch instruction may test in one cycle.

Figures 3, 5:
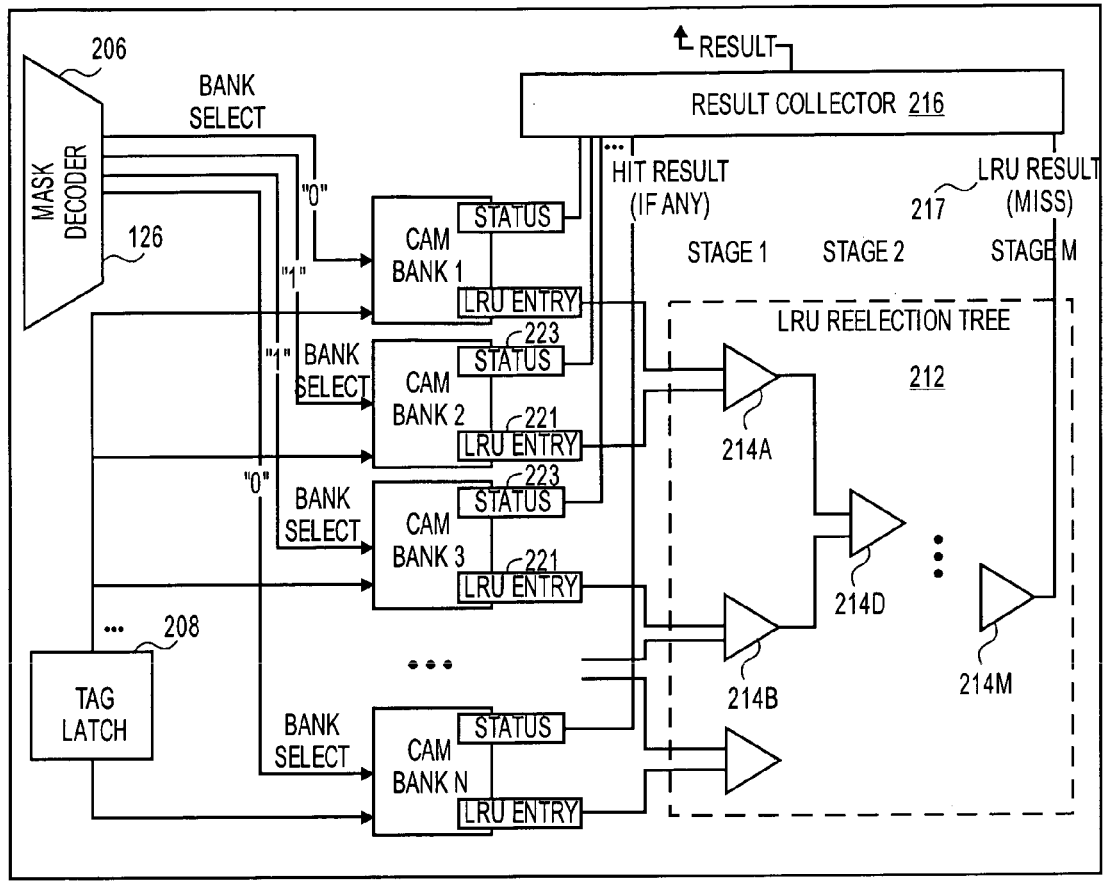
FIG. 3 illustrates a mask according to an embodiment of the present invention.
FIG. 5 is a schematic diagram illustrating a "miss" result according to an embodiment of the present invention.

FIG. 3 illustrates the mask 126 with a mask value 300 that indicates that that the tag is to be looked up in CAM bank 2 and CAM bank 3 according to an embodiment. In the illustrated embodiment, "0" indicates that a CAM bank is to be disabled and "1" indicates that a CAM bank is to be enabled.

Of course, in other embodiments, other conventions may be used. For example, in other embodiments, "1" may indicate that a CAM bank is to be disabled and "0" may indicate that a CAM bank is to be enabled. In embodiments of the present invention, the number of bits supported by the mask 126 may determine the number of CAM banks that can be controlled. For example, if the mask 126 supports thirty-two bits, then thirty-two CAM banks may be controlled. In the illustrated embodiment, N bits are used to control N CAM banks.

Figure 4:
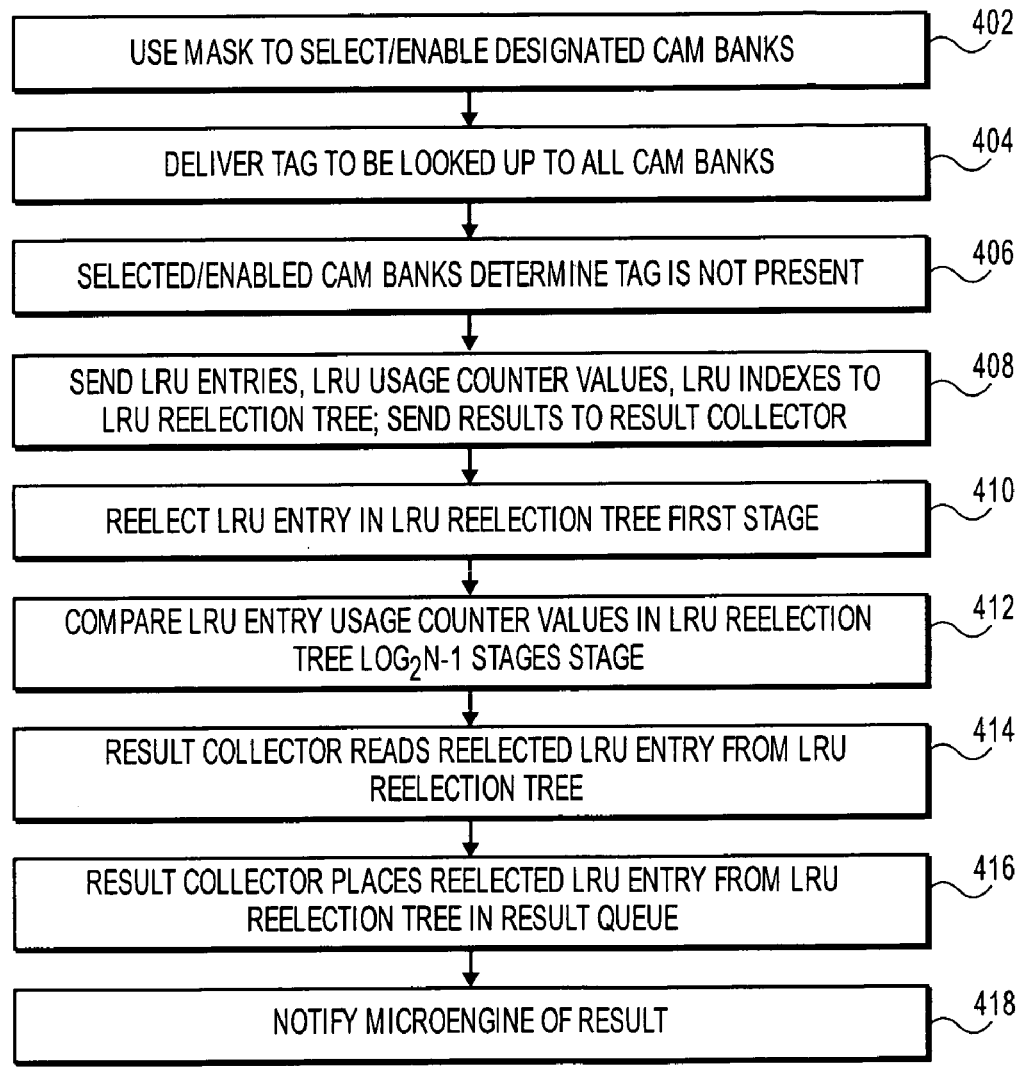
FIG. 4 is a flowchart illustrating an approach to implementing a content addressable memory (CAM) unit for a "miss" result according to an embodiment of the present invention.

For purposes of illustration, suppose further that the tag 210 is not present in either CAM bank 2 or CAM bank 3, which results in a "miss." FIG. 4 is a flowchart of a process 400 illustrating a "miss" result for a lookup in CAM bank 2 and CAM bank 3 according to an embodiment of the present invention.

The operations of the process 400 are described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the process 400 is an example process and other processes may be used to implement embodiments of the present invention. A machine-accessible medium with machine-readable instructions thereon may be used to cause a machine, for example, a processor, to perform the process 400.

The process 400 will be described with reference to FIG. 5, which is a schematic diagram of the CAM module 124 illustrating a "miss" result according to an embodiment of the present invention.

In a block 402, the mask decoder 206 may use the mask 126 with the mask value 300 ("0110") to select CAM bank 2 and CAM bank 3 and deselect CAM bank 1, and CAM bank 3 through CAM bank N.

In a bock 404, the tag latch 208 may deliver the tag 210 to CAM bank 1 through CAM bank N.

In a block 406, CAM bank 2 may determine that the tag 210 is not present in CAM bank 2 and CAM bank 3 may determine that the tag 210 is not present in CAM bank 3. In one embodiment, CAM bank 2 and CAM bank 3 make a comparison of the tag 210 with their entries.

In a block 408, CAM bank 1, CAM bank 2, CAM bank 3, and CAM bank N send their LRU entries 221 to the LRU entry reelection tree 212. The CAM bank 1, CAM bank 2, CAM bank 3, and CAM bank N also report their "miss" statuses 223 to the result collector 216. In embodiments of the present invention, an LRU entry may include a LRU entry usage counter value and a LRU entry index associated therewith, and CAM bank 1, CAM bank 2, CAM bank 3, and CAM bank N may send their associated LRU entry usage counter values and associated LRU entry indexes to the LRU entry reelection tree 212.

In a block 410, the LRU entry is reelected at each stage of the LRU entry reelection tree 212. In one embodiment, the comparator 214A may compare the LRU entry usage counter value from CAM bank 1 with the LRU entry usage counter value from CAM bank 2, select the lower LRU entry usage counter value, and pass a record to the next stage in the LRU tree 212. The record may include the LRU entry index and LRU entry usage counter value of the reelected LRU entry. If the input values are equal, then the comparator 214 may select the LRU entry on a predetermined input and pass the predetermined input to stage 1 in the LRU entry reelection tree 212.

In embodiments, the deselected or disabled CAM bank 1 may have a LRU entry usage counter value equal to the maximal value available for it (for example, 0xFFFFFFFF for thirty two bits capacity of the usage counter) and the selected or enabled CAM bank 2 may have a LRU entry usage counter value of 0x00000000 (on the first lookup, for example). The deselected or disabled CAM bank 3 may have a LRU entry usage counter value of 0xFFFFFFFF and the selected or enabled CAM bank 3 may have a LRU entry usage counter value of 0x00000000 (on the first lookup, for example). In the illustrated embodiment, the comparator 214A selects the LRU entry usage counter value from CAM bank 2 and passes it to the LRU comparator 214D. The comparator 214B selects the LRU entry usage counter value from CAM bank 3 and passes it to the LRU comparator 214D.

In a block 412, the LRU entry is reelected in subsequent stages of the LRU entry reelection tree 212. In one embodiment, the comparator 214D compares the LRU entry usage counter value from CAM bank 2 with the LRU entry usage counter value from CAM bank 3. Because according to the example the LRU entry usage counter value from CAM bank 2 may be equal to the LRU entry usage counter value from CAM bank 3, for example, 0x00000000, the comparator 214D selects the LRU entry usage counter value from its predetermined input. In one embodiment, the comparator 214D may select the LRU entry usage counter value from CAM bank 2 and pass it to stage 1. In embodiments, LRU entry usage counter values may be reelected until $\log_2 N-1$ stages in the LRU entry reelection tree 212 have been implemented.

In a block 414, the result collector 216 reads the reelected LRU entry 221 from the comparator 214M at stage M of the LRU entry reelection tree 212. In one embodiment, the result 217 is ready at stage M after a predetermined number of clock cycles, such as $\log_2 N$ clock cycles (where N is the number of CAM banks in the CAM unit 124), for example. Thus, the number of stages M is equal to $\log_2 N$.

In a block 416, the result collector 216 may place the result in the result queue 218 and one or more transfer registers (not shown) in the microengine (shown below) that issued the command 201 to look up the tag 210 may be updated with the status stored in the status register 223 indicating that the lookup operation is a "miss" and of the index of the LRU entry 221 output from the LRU entry reelection tree 212. In one embodiment, the microengine may read the result 217 of the lookup. If the result 217 is a "miss", the microengine may perform a slow lookup according to a technique such as hashing, five-tuples-matching, longest prefix math (LPM), or other appropriate technique to process a network packet, for example. In embodiments, a slow lookup may utilize a number of reads of static random access memory (SRAM) or dynamic random access memory (DRAM) and may use hardware hashing, for example. To accelerate a next execution of the packet processing for the similar network packet (to be processed in the same way) the microengine may write the information (that speeds up that processing) to the elected LRU entry 221. In one embodiment, one bit in the status value stored in the status register 223 may be used to indicate that the result of the lookup operation is a "miss" and other bits may indicate the index of the reelected LRU entry 221 output from the LRU entry reelection tree 212.

In a block 418, the microengine issuing the command may be signaled that the operation has been executed.

Figure 6:
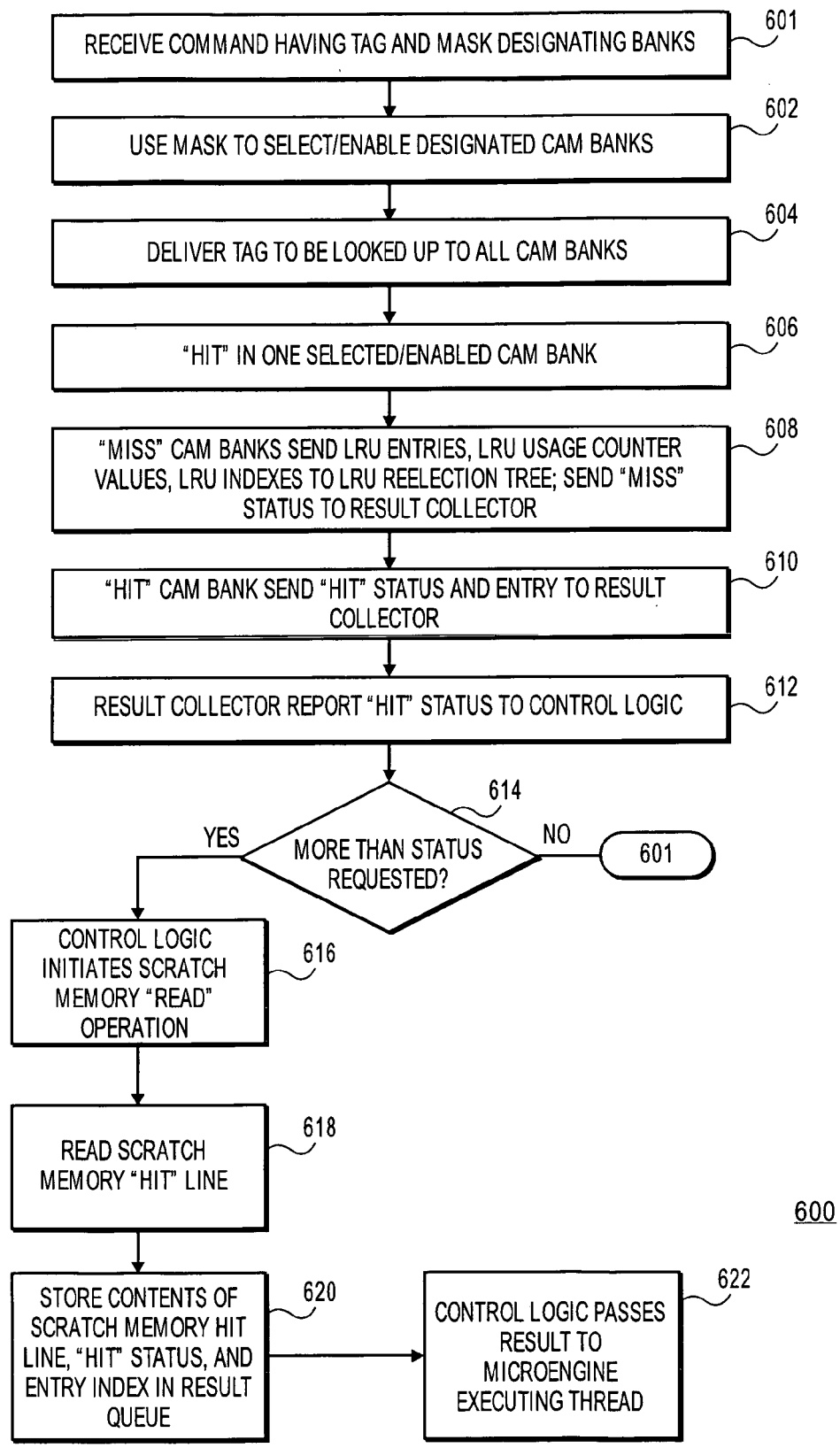
FIG. 6 is a flowchart illustrating an approach to implementing a content addressable memory (CAM) unit for a "hit" result according to an embodiment of the present invention.

For purposes of illustration, suppose that a microengine again issues a command 201 to lookup the tag 210 in CAM bank 2 and CAM bank 3 and not in the other CAM banks, but that the tag 210 is present in CAM bank 3, which results in a "hit" in CAM bank 3. FIG. 6 is a flowchart of a process 600 illustrating a "hit" result for CAM bank 3 according to an embodiment of the present invention. The operations of the process 600 are described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented.

Of course, the process 600 is an example process and other processes may be used to implement embodiments of the present invention. A machine-accessible medium with machine-readable instructions thereon may be used to cause a machine, for example, a processor, to perform the process 600.

Figure 7:
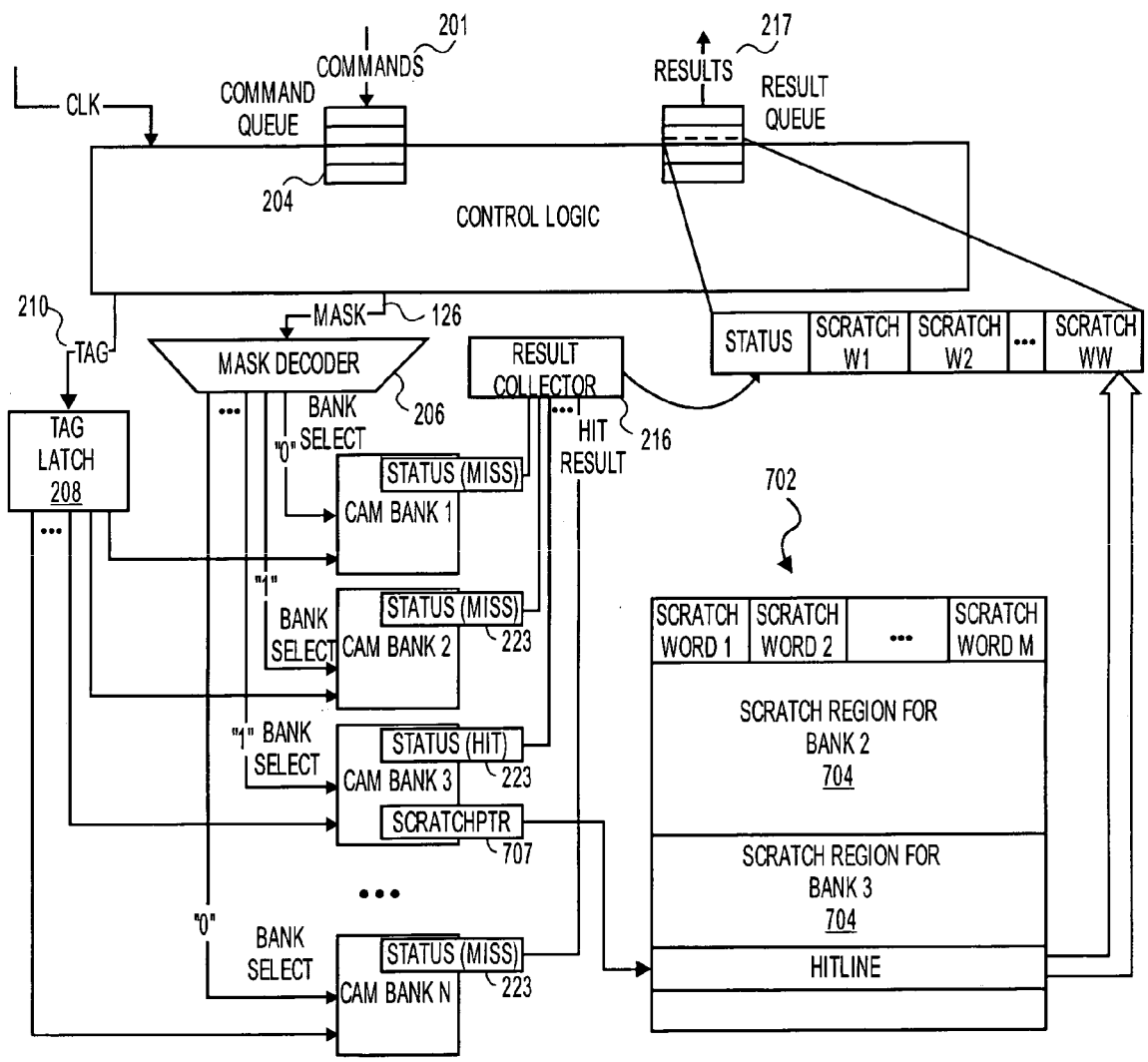
FIG. 7 is a schematic diagram illustrating a "hit" result according to an embodiment of the present invention.

The process 600 will be described with reference to FIG. 7, which is a schematic diagram of the CAM module 124 illustrating a "hit" result according to an embodiment of the present invention.

In a block 601, the control logic 202 receives the command from the command queue 204. In one embodiment, the command includes the tag 210 to be looked up and the mask 126 having the mask value 300 ("0110") to select/enable CAM banks 2 and 3 and to deselect/disable other CAM banks.

In a block 602, the mask decoder 206 may use the mask 126 with the mask value 300 ("0110") to select/enable CAM bank 2 and CAM bank 3 and deselect/disable CAM bank 1, and CAM bank 3 through CAM bank N.

In a bock 604, the tag latch 208 may deliver the tag 210 to CAM bank 1 through CAM bank N.

In a block 606, CAM bank 2 may determine that the tag 210 is not present in CAM bank 2 and CAM bank 3 may determine that the tag 210 is present in CAM bank 3.

In a block 608, CAM bank 1, CAM bank 2, and CAM banks 4 (not shown) through CAM bank N may report their "miss" statuses 223 to the result collector 216.

In a block 610, CAM bank 3 may report its "hit" status stored in the status register 223 and the index for the entry having the tag 210 to the result collector 216.

In a block 612, the result collector 216 may report the "hit" status to the control logic 202.

In a block 614, control logic 202 may determine whether the microengine is requesting more than CAM bank 3 "hit" status. If the control logic 202 determines that the microengine is requesting more information than CAM bank 3 "hit" status, then in a block 616, the control logic 202 may issue a memory read operation. In one embodiment, the control logic 202 may issue a read operation for a memory, such as a scratch memory 702, for example. The scratch memory 702 may have one or more regions 704 associated with each CAM bank. The size of a region 704 may be the product of the number of entries in an associated CAM bank and the number of consecutive scratch words in the region 704. The regions include one or more memory lines 706. A CAM bank may include the base address of its associated region 704 and the size of the memory line 706.

In a block 618, the CAM bank 3 may use the base address of its associated region 704, the size of the memory line 706, and the entry index of the "hit" to determine a scratch memory line pointer 707 for the information to be read and the scratch memory line pointed to may be read and the scratch words placed in the result queue 218. In one embodiment, one or more transfer registers (not shown) in the microengine (shown below) that issued the command to look up the tag 210 may be updated with the status indicating that the lookup operation is a "hit." Additionally, the entry index for the tag 210 and scratch words pointed to, such as scratch W1, W2 . . . WM, for example, may be placed in the transfer registers from the result queue 218.

In a block 622, the microengine issuing the command may be signaled that the operation has been executed.

If, on the other hand, in the block 614, control logic 202 determines that the microengine is not requesting more than CAM bank 3 "hit" status, then the process 600 returns to the block 601 to receive more commands from other microengines in the network processor 122, for example.

Thus, every CAM lookup operation includes a value for the mask 126. The value is used to select/enable and deselect/disable a CAM bank according to the command 201 from the particular microengine.

In one embodiment, the CAM banks may act as a tag store of a cache. In this embodiment, the entry number of a matching looked up value can be used as an index to data associated with the matching value (and stored, for example, in SRAM or local memory (shown and described below with reference to FIG. 8)).

In embodiments of the present invention, one or more of the CAM banks may have sixteen entries 219, for example, and each entry 219 may store a thirty-two-bit value. Of course, other sizes are possible and after reading the description herein a person of ordinary skill in the relevant art will readily recognize how to implement embodiments for other CAM sizes. Additionally, the CAM banks do not have to include the same number of entries 219 or the same number of bits in the values in the entries.

Figure 8:
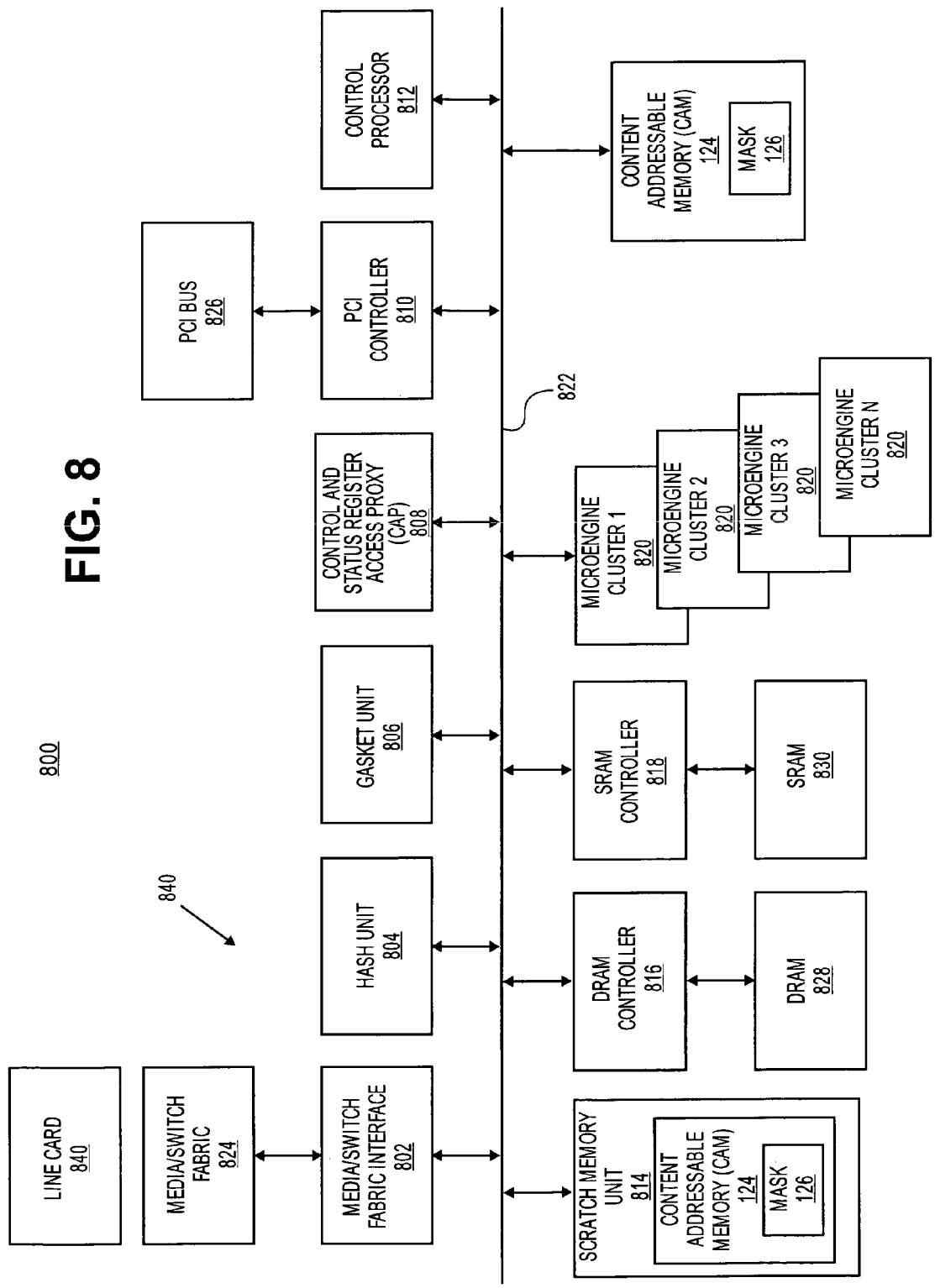
FIG. 8 is a high-level block diagram of a communication system according to an embodiment of the present invention.

FIG. 8 is a high-level block diagram of a system 800 according to an embodiment of the present invention. The illustrated system 800 includes a media/switch fabric interface 802, a hash unit 804, a gasket unit 806, a control and status register access proxy (CAP) 808, a peripheral component interconnect (PCI) controller 810, a control processor 812, a scratch memory unit 814, a dynamic random access memory (DRAM) controller 816, a static random access memory (SRAM) controller 818, several microengine clusters 820, and CAM unit 124 coupled to a bus 822.

The media/switch fabric interface 802, hash unit 804, gasket unit 806, CAP 808, PCI controller 810, control processor 812, scratch memory unit 814, DRAM controller 816, SRAM controller 818, microengine clusters 820, and CAM unit 124, and bus 822 may form the network processor 122. The network processor 122 may be part of a line card 840 (or blade), which may include one or more physical layer (PHY) devices (not shown), such as optic, wire, and/or wireless PHY devices, for example, that may handle communication over network connections. The line cards may include framer devices (not shown) such as Ethernet, SONET, High-Level Data Link (HDLC) framers or other layer "2" devices, for example.

The illustrated system 800 also includes a media/switch fabric 824, which may be coupled to the media/switch fabric interface 802, a PCI bus 826, which may be coupled to the PCI controller 810, a DRAM 828, which may be coupled to the DRAM controller 816, and a SRAM 830, which may be coupled to the SRAM controller 818. The media/switch fabric 824 may be coupled to a second line card 840. Although only two line cards are illustrated in embodiments of the present invention multiple line cards may be present in the system 800.

The media/switch fabric interface 802 may be a common switch interface (CSIX interface) that enables the network processor 122 to transmit a packet to other processors or circuitry coupled to the media/switch fabric interface 802. The media/switch fabric 824 may conform to CSIX or other fabric technologies, such as HyperTransport, Infiniband, PCI-X, Packet-Over-SONET, RapidIO, and/or Utopia.

In embodiments of the present invention, the mask 126 may be accessible by all microengines 820. In alternative embodiments, the mask 126 may be accessible from the control processor 812 via the gasket unit 806 and/or the CAP 808.

The PCI controller 810 and PCI bus 826 may be used for communicating with one of the hosts 112, 114, 116, 118, and/or 120.

Although embodiments of the present invention are described with respect to the CAM unit 124 being integrated with the scratch memory unit, such as, for example, the control logic 202 having the command queue 204 and the result queue 218 to cope with simultaneous invokes of the CAM operations, embodiments are not so limited. For example, as shown in the illustrated embodiment, the CAM unit 124 including the mask 126 may be a separate unit coupled to the bus 822.

A microengine 820 may offer multiple threads. For example, the multi-threading capability of a microengine may be supported by hardware that reserves different registers for different threads and can quickly swap thread contexts. In addition to accessing shared memory such as DRAM 828 and SRAM 830 via DRAM controller 816 and SRAM controller 818, respectively, for example, a microengine 820 may include a local memory (not shown) and a CAM (not shown) that is not banked or sharable with other microengines 820. Microengines 820 may communicate with each other using registers wired to the adjacent microengine or via shared memory such as DRAM, SRAM, and/or the sharable, banked CAMs in the CAM unit 124.

Although embodiments of the present invention are described with respect to a network processor or a device incorporating a network processor, the techniques that may be implemented in other hardware, firmware, and/or software. For example, the techniques may be implemented in integrated circuits (ASICs, gate arrays, and so forth).

Referring back to FIG. 2, in addition to being responsible for controlling the stages of CAM lookup operations as described above, in embodiments of the invention, the control logic 202 also may ensure that the CAM banks are cleared as appropriate, that the entries 219 are written to the CAM banks, that the CAM unit 124 is initialized as appropriate, etc. Additionally, the control logic 202 may effect retrieval of statuses 223 from the CAM banks and determine when the result collector 216 has a valid result 217.

In embodiments of the present invention, one or more CAM banks may have a separate configuration for using the scratch memory unit 814. For example, table 1 in CAM bank 1 may have eight-byte entries 219 and table 2 in CAM bank 2 may have thirty-two-byte entries 219. A programmer may assign scratch lines 706 that have eight bytes to CAM banks 1 and 2. The programmer may assign scratch lines 706 that have thirty-two bytes to CAM banks 3 and 4. In this embodiment, the CAM lookup that accelerates accesses to table 1 has a value for the mask 126 that chooses CAM banks 1 and 2. In the event of a "hit," the appropriate eight-byte scratch line 706 may be read and returned within the transfer registers to the microengine 820 issuing the command 201. Alternatively, a value for the mask 126 that chooses CAM banks 2 and 3 may read up to thirty-two bytes of the appropriate scratch line 706 upon "hit." The CAP 808 may write the CAM bank configurations.

In embodiments of the invention, the LRU entry reelection tree 212 may be responsible for dynamically resolving LRU entry indexes within a particular mask during auto-write back of a tag 210 and cached information to a scratch line 706 replacing a LRU entry 221 during a "miss" operation. Suppose, for example, microengine 820A and microengine 820B missed in lookups for tags 210X and 210Y. Both microengine 820A and microengine 820B received the same LRU entry index and when microengine 820A and microengine 820B substantially simultaneously write back the tags 210X and 210Y as well as the LRU entry 221 to be cached, microengine 820A and microengine 820B would write the same LRU entry 221 if the LRU entry index were used. In embodiments of the present invention, the LRU entry index passed with the tags 210X and 210Y is not used in the write-back. Instead, the LRU entry index reelected after $\log_2 N$ stages of the LRU entry reelection tree 212 is used for the write-back.

In alternative embodiments of the present invention, a thread of a microengine 820 in the network processor 122 may issue a "CAM-Lookup-With-Lock" command 201, for example. A "CAM-Lookup-With-Lock" command 201 may be executed to lookup the tag 210 in designated CAM banks and automatically lock the CAM entry 219 that might be "hit" in the lookup. The lock of a CAM entry 219 may mean that the thread that executed the lock is the owner of that particular entry 219. The lock of a CAM entry 219 also may mean that there may be no other threads among the microengines 820 access the locked entry 219 or the associated information stored within the locked entry 219 (such as, for example, within the associated scratch memory line 706).

In embodiments, there may be three results 217 of execution of the "CAM-Lookup-With-Lock" command 201. A "miss" result 217 may indicate that the looked up tag 210 was not found in an entry 219 in the designated CAM banks. A "miss" result 217 may contain a value of the LRU entry index, for example 0xFFFFFFFF, to indicate that all entries 219 within the designated CAM banks are locked and cannot be written with the tag 210 that was not found in the lookup.

If the thread wishes to write the looked up tag 210 to an entry 219 within the designated CAM banks, designated CAM banks may be pooled to wait for unlocked entry.

A "hit-owner" result 217 may indicate that the lookup tag 210 was found in an entry 219 in a designated CAM bank and a microengine 820 thread (such as, for example, a thread of the microengine 820A) has become the owner of that CAM entry 219.

A "hit-locked" result 217 may indicate that the lookup tag 210 was found in an entry 219 in a designated CAM bank and another microengine thread (such as, for example, another thread of the same (820A) or another (820B) microengine) is the owner of that CAM entry 219. A thread that has received a "hit-locked" result 217 may repeat the lookup until it receives the "hit-owner" result 217.

Figure 9:
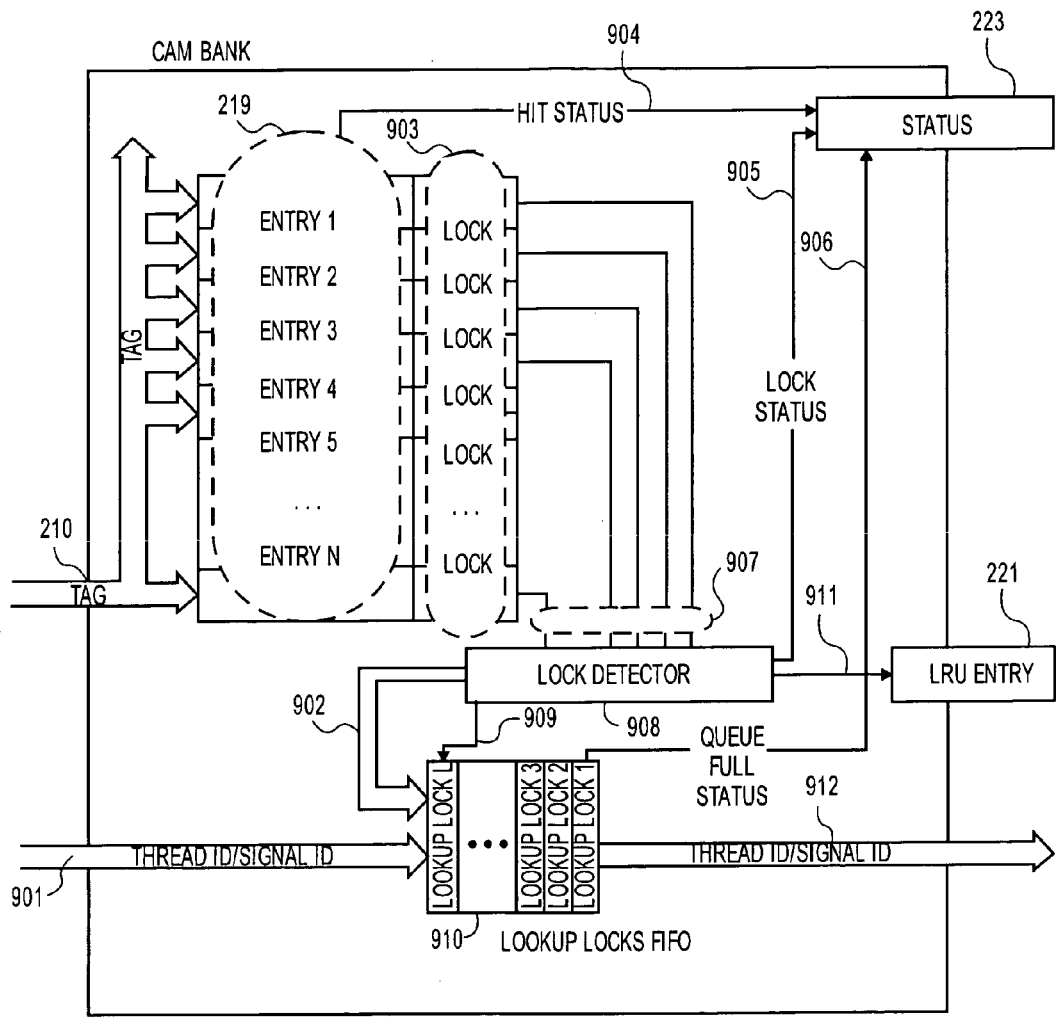
FIG. 9 is a schematic diagram of a content addressable memory (CAM) according to an alternative embodiment of the present invention.

FIG. 9 is a schematic diagram of a CAM bank 900 within the CAM unit 124 in which execution of a "CAM-Lookup-With-Lock" command 201 is illustrated according to an embodiment of the present invention. In the illustrated embodiment, the CAM bank 900 includes a bus 901, which transports one or more thread identifiers and thread wake-up signal identifiers (hereinafter "thread ID/signal ID") 912 into and out of a lookup locks first-in-first-out (FIFO) 910, a bus 902, which may transport one or more "hit" entry indexes from a lock detector 908 to the FIFO 910, one or more registers 903 associated one-to-one with the entries 219, a "hit" status line 904, which couples a signal that indicates the "hit" status from the registers 903 to the CAM bank 900 status register 223, a lock status line 905, which couples a signal that indicates a lock status from the lock detector 908 to the CAM bank 900 status stored in the status register 223, a queue full status line 906, which couples a signal that indicates whether the FIFO 910 is full to the status register 223, one or more lines 907, which couple information from the lock detector 908 to the registers 903, a line 909, which couples a signal that indicates that a lookup attempt that hit locked entry 219, and a line 911, which couples a locked entry index to the CAM bank 900 LRU entry 221 register.

In embodiments of the present invention, LRU entries 221 and/or other entries 219 may be in predetermined locations in the CAM bank 900. Accordingly, indexes for LRU entries 221 and/or other entries 219 can be determined from the location of the LRU entries 221 and/or other entries 219 on the lines 907.

In embodiments of the present invention, the lock detector 908 may detect whether a "hit" entry 219 is locked during the "CAM-Lookup-With-Lock" command 201 execution in the designated CAM banks. If the "hit" entry 219 is unlocked, then the lock detector 908 may write the appropriate register 903 to be locked using the lines 907. If the "hit" entry 219 is locked, then the lock detector 908 may inform the status register 223 through the lock status line 905 that the status is "hit-locked." In one embodiment, the value of status may be a logic function of the lock status line 905. The lock detector 908 also may detect whether all entries 219 are locked during execution of a "CAM-Lookup-With-Lock" command 201 that produces a "miss".

The lock detector 908 also may enforce (through the line 911, for example) that a LRU entry 221 does not include an index of a locked entry 219. For example, in the situation when all entries 219 may be locked, the value of LRU entry index may be special (as described above, 0xFFFFFFFF, for example) and the value of LRU entry usage counter may have the maximal available value, for example "1" (for thirty two bits capacity of the LRU entry usage counter, the value maybe equal to 0xFFFFFFFE). Assigning such a large LRU entry usage counter value may ensure that the LRU entry is chosen from the other designated CAM banks with mask 126 if there are any unlocked entries 219 within the other designated CAM banks.

In embodiments of the present invention, the lookup locks FIFO 910 may store a number of L lookup attempts that "hit" a locked entry 219 (where L is the depth of the FIFO 910). For these lookups, the designated CAM bank may report the status value stored in the status register 223 indicating a "lookup-hold," which may mean that the result collector 216 in the CAM unit 124 has postponed delivering the result 217 to the microengine 820 executing the "CAM-Lookup-With-Lock" command 201. The information stored in a queue in the FIFO 910 may include the "hit" entry index (delivered with the bus 902 from the lock detector 908, for example), the thread ID/signal ID 912 (delivered with the bus 901 from the control logic 202, for example).

In one embodiment, the postpone interval may end when the thread that owned the locked entry 219 has executed a "CAM-Entry-Unlock" command 201, which may trigger the lookup locks FIFO 910 to find the longest queued lookup attempt for a particular entry index. The longest queued lookup attempt may be determined for a particular entry index (that may be transported on the bus 902 at this time) in the FIFO 910. The CAM bank may sends to its output the thread ID/signal ID 912 substantially simultaneously with reporting the status as "hit-owner" with the entry index of the entry 219 that has been unlocked with the "CAM-Entry-Unlock" command 201. Along with the result collector 216 and the control logic 202, the status of "hit-owner" may be returned to a thread as the "hit-owner" result 217 and the control logic 202 may wake up a microengine thread as identified with the thread ID/signal ID 912. Because the result 217 delivered to that thread is "hit-owner" the thread may use that result 217 as a normal successful completion of the lookup.

In embodiments of the present invention, the depth of the lookup locks FIFO 910 may be limited and, as described above, may have the value of L. Therefore, only for L threads the lookup might wait within the CAM bank if their hit entries were previously locked. If L+1 thread performs the "CAM Lookup-With-Lock" command 201, then the lookup locks FIFO 910 may report a "queue-full" status (through line 906, for example) to the status register 223. The "queue full" status, combined with "hit" status reported on line 903 may produce the "hit-locked" status. The status 223 of "hit-locked" may be returned to a thread as the "hit-locked" result 217 (using the result collector 216 and the control logic 202, for example). As described above, a thread that has received a "hit-locked" result 217 may repeat the lookup until it receives the "hit-owner" result 217.

In embodiments of the present invention, the lookup locks FIFO 910 may be a part of the control logic 202 instead of a CAM bank such as the CAM bank 900, for example. In this implementation, the CAM banks may not have circuitry substantially equivalent to the lookup locks FIFO 910. Also, the status register 223 may still store the status of the CAM banks as "hit-locked", "hit-owner", and "miss".

FIG. 10 is a diagram showing a CAM bank 1000 according to an embodiment of the present invention. In the illustrated embodiment, the CAM bank 1000 includes section 1002 to store a number of entries/tags (content addresses), for example, a section 1004 to store the lock status of individual entries, for example, a section 1006 to store usage counter values for individual entries, for example, a section 1008 to store a base address of scratch memory region for the bank 1000, for example, and a section 1010 to store a scratch memory word line size for the bank 1000, for example.

Although embodiments of the present invention are described with respect to packet-switched networks, embodiments of the present invention are not so limited. For example, embodiments of the present invention can be implemented in circuit-switched networks. After reading the description herein a person of ordinary skill in the relevant art will readily recognize how to implement embodiments in circuit-switched networks.

Embodiments of the present invention may be implemented using hardware, software, or a combination thereof. In implementations using software, the software may be stored on a machine-accessible medium.

A machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), as well as electrical, optical, acoustic, or other form of propagated signals (e.g., carrier waves, infrared signals, digital signals, etc.).

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method, comprising:
    receiving a command from a microengine, the command to include an entry to be looked up in a designated content addressable memory (CAM) bank chosen from among N CAM banks;
    applying the entry to the N CAM banks;
    enabling the designated CAM bank and disabling remaining CAM banks based on a mask, the mask being based on the command from the microengine;
    performing a lookup of the entry in the enabled CAM bank; and
    upon a "miss" in the designated CAM bank, reelecting a least recently used (LRU) entry by comparing LRU entries from the N CAM banks in $\log_2 N$ comparison stages.

2. The method of claim 1, further comprising determining a least recently used (LRU) entry in the enabled CAM bank.

3. The method of claim 2, further comprising determining an index for the LRU entry.

4. The method of claim 3, further comprising determining that the index for the LRU entry includes a value to indicate that entries in the designated CAM bank cannot be written to with the entry to be looked up.

5. The method of claim 3, further comprising making the LRU entry, the index for the LRU entry, and the lookup status available to the microengine.

6. The method of claim 1, further comprising determining the lookup status is a "hit".

7. The method of claim 6, further comprising determining the lookup status is a "hit-locked".

8. The method of claim 6, further comprising determining the lookup status is a "hit-owner".

9. The method of claim 6, further comprising determining an index of the entry in the enabled CAM bank.

10. The method of claim 9, further comprising reading data associated with the index.

11. The method of claim 10, further comprising making the data, the index for the entry, and the lookup status available to the microengine.

12. An apparatus, comprising:
    a network processor having:
        at least one microengine to issue at least one command to perform a lookup of an entry in at least one designated content addressable memory (CAM) bank chosen from among N CAM banks;
        a scratch memory unit to store at least one word associated with the entry;
        a CAM unit to enable the designated CAM bank to perform the lookup of the entry and to disable remaining CAM banks from performing the lookup of the entry; and
        a least recently used (LRU) reelection tree having $\log_2 N$ comparison stages, the LRU entry reelection tree to reelect a LRU entry from among the N CAM banks upon a "miss" in the designated CAM bank.

13. The apparatus of claim 12, the designated CAM bank further comprising a pointer to point to a word line in the scratch memory unit banks upon a "hit" in the designated CAM bank.

14. An apparatus, comprising:
    a network processor having:
        at least one microengine to issue at least one command to perform a lookup of an entry in at least one designated content addressable memory (CAM) bank chosen from among N CAM banks;
        a scratch memory unit to store at least one word associated with the entry, the scratch memory unit having a CAM unit to enable the designated CAM bank to perform the lookup of the entry and to disable remaining CAM banks from performing the lookup of the entry, the CAM unit having a command queue to buffer the command received from the microengine and a result queue to buffer at least one result to be sent to the microengine, the result to indicate whether the lookup is a "miss" or a "hit" in the designated CAM bank; and $\log_2 N$ comparison stages to reelect a least recently used (LRU) entry from among the N CAM banks upon a "miss" in the designated CAM bank.

15. The apparatus of claim 14, the designated CAM bank further comprising a pointer to point to a word line in the scratch memory unit banks upon a "hit" in the designated CAM bank.

16. A method, comprising:
    selecting at least one designated content addressable memory (CAM) bank chosen from among N CAM banks to perform a lookup of an entry;
    deselecting remaining CAM banks in the N CAM banks, the selecting and deselecting being based on a mask value determined by a command from at least one microengine;
    performing a lookup of the entry in the designated CAM bank; and
    upon a "miss" in the designated CAM bank, reelecting a least recently used (LRU) entry by comparing LRU entries from the N CAM banks in $\log_2 N$ comparison stages.

17. The method of claim 16, further comprising determining an index for the reelected LRU entry.

18. The method of claim 17, further comprising making the reelected LRU entry, the index for the reelected LRU entry, and "miss" status available to the microengine.

19. The method of claim 16, further comprising:
    receiving a command from a first thread of a first microengine, the command to include a tag to be looked up in the at least one designated 20. A system, comprising:
    at least two line cards, an individual line card having a network processor having at least one microengine to issue at least one command to perform a lookup of an entry in at least one designated content addressable memory (CAM) bank chosen from among N CAM banks, a scratch memory unit to store at least one word associated with the entry, a CAM unit to enable the designated CAM bank to perform the lookup of the entry and to disable remaining CAM banks from performing the lookup of the entry, and $\log_2 N$ comparison stages to reelect a least recently used (LRU) entry from among the N CAM banks upon a "miss" in the designated CAM bank; and
    a switch fabric coupled to the network processor to couple the two line cards together.

21. The system of claim 20, wherein the switch fabric is a common switch interface (CSIX) switch fabric.

22. The system of claim 20, wherein the switch fabric is a Packet-Over-SONET switch fabric.

23. An article of manufacture, comprising:
    a machine accessible storage medium including data that, when accessed by a machine, cause the machine to perform operations comprising,
        receiving a command from a microengine, the command to include an entry to be looked up in a designated content addressable memory (CAM) bank chosen from among N CAM banks;
        applying the entry to the N CAM banks;
        enabling the designated CAM bank and disabling remaining CAM banks based on a mask, the mask being based on the command from the microengine;
        performing a lookup of the entry in the enabled CAM bank; and
        upon a "miss" in the designated CAM bank, reelecting a least recently used (LRU) entry by comparing LRU entries from the N CAM banks in $\log_2 N$ comparison stages.

24. The article of manufacture of claim 23, wherein the machine accessible storage medium further includes data that cause the machine to perform operations comprising determining the lookup status is a "miss".

25. The article of manufacture of claim 23, wherein the machine accessible storage medium further includes data that cause the machine to perform operations comprising determining the lookup status is a "hit".

26. The article of manufacture of claim 24, wherein the machine accessible storage medium further includes data that cause the machine to perform operations comprising determining the lookup status is a "hit".

* * * * *

UNITED STATES PATENT AND TRADEMARK OFFICE
CERTIFICATE OF CORRECTION

| | |
|---|---|
| PATENT NO. | : 7,281,083 B2 |
| APPLICATION NO. | : 10/882830 |
| DATED | : October 9, 2007 |
| INVENTOR(S) | : Madajczak |

It is certified that error appears in the above-identified patent and that said Letters Patent is hereby corrected as shown below:

Column 13, at line 30, after "designated" insert --CAM bank; applying the tag to the several CAM banks; determining that a second microengine or a second thread in the first microengine owns the entry in which the tag is present.--.

Column 14, at line 36, delete "26. The article of manufacture of claim 24, wherein the machine accessible storage medium further includes data that cause the machine to perform operations comprising determining the lookup status is a "hit"".

Signed and Sealed this

Twenty-fourth Day of June, 2008

JON W. DUDAS
*Director of the United States Patent and Trademark Office*